United States Patent [19]
Yoon et al.

[11] Patent Number: 6,046,954
[45] Date of Patent: Apr. 4, 2000

[54] CIRCUIT FOR CONTROLLING INTERNAL VOLTAGE FOR OUTPUT BUFFER OF SEMICONDUCTOR MEMORY DEVICE AND METHOD THEREFOR

[75] Inventors: Sei-seung Yoon; Yong-cheol Bae, both of Seoul, Rep. of Korea

[73] Assignee: Samsung Electronics, Co., Ltd., Suwon, Rep. of Korea

[21] Appl. No.: 09/062,794

[22] Filed: Mar. 31, 1998

[30]   Foreign Application Priority Data

Mar. 31, 1997  [KR]   Rep. of Korea ....................... 97-11830

[51] Int. Cl.$^7$ ....................................................... G11C 7/00
[52] U.S. Cl. ............................................ 365/226; 365/228
[58] Field of Search .................................... 365/226, 227, 365/228, 229; 327/536

[56]             References Cited

U.S. PATENT DOCUMENTS 5,434,498  7/1995  Cordoba et al. ......................... 323/313
5,875,146  2/1999  Itou ........................................ 365/226

*Primary Examiner*—David Nelms
*Assistant Examiner*—Anh Phung
*Attorney, Agent, or Firm*—Marger Johnson & McCollom, P.C.

[57]             ABSTRACT

In a semiconductor memory device, a plurality of output buffers, one for each output data bit, are powered by an internal voltage control circuit so as to provide high speed operation yet minimize power consumption. The internal voltage control circuit inclues multiple internal voltage generators. Responsive to the number of output buffers in use during a read operation, one or more of the voltage generators are activated to power the output buffers. Additionally, the current capacity of each of the individual voltage generators is controlled responsive to the number of output buffers in use during the read operation, so that bandwidth of the memory device is maximized but power is not wasted.

20 Claims, 9 Drawing Sheets

CIRCUIT FOR CONTROLLING INTERNAL VOLTAGE FOR OUTPUT BUFFER OF SEMICONDUCTOR MEMORY DEVICE AND METHOD THEREFOR

BACKGROUND OF THE INVENTION

1. Field of the Invention

The present invention relates to a semiconductor memory device, and more particularly, to a circuit for controlling an internal voltage for output buffer portions of a semiconductor memory device, and a method therefor.

2. Description of the Related Arts

With the recent trend towards increasing the integration of semiconductor memory devices, the data output speed and bandwidth increases. In particular, as a burst operation which is a kind of output mode of a synchronous DRAM becomes important, the gap between the output hold time (tOH) and the data output time (tSAC) becomes an important parameter. When the gap is added to the determined output hold time and data output time, it becomes the cycle time (tCC). Accordingly, the cycle time (tCC) increases with the increase of the gap. When cycle time increases, the bandwidth of the semiconductor memory device decreases, which is not desirable.

The gap between the output hold time and the data output time increases due to variations in a supply voltage (Vcc), a temperature or process parameters and a variation in electrical characteristics between output pins, etc. Among them, variations in the supply voltage change and the temperature are critical. The increase in the gap due to the supply voltage change is reduced by use of an internal voltage generator for an output buffer. Since the internal voltage generator which is used only for output buffers is not much influenced by the variation of an external supply voltage, e.g., voltage ranging from 3.0 V to 3.6 V, it can provide current at a relatively constant level to output buffers. In order to control the current supply capability, an internal voltage controlling circuit can be used.

FIG. 1 is a block diagram for explaining a conventional internal voltage controlling circuit in a semiconductor memory device. In FIG. 1, an internal voltage control circuit 17 of a semiconductor memory device 11 is drawn along with first to eighth output buffers 21 to 28. Even though FIG. 1 shows eight output buffers 21 through 28 and two internal voltage generators 13 and 15, 32 output buffers and 4 internal voltage generators may be used, instead.

The internal voltage control circuit 17 includes the first and second internal voltage generators 13 and 15. The internal voltage control circuit 17 receives an external control signal (EN) and generates an internal voltage (IVC). When the external control signal (EN) is active, each of the first and second internal voltage generators 13 and 15 generates a predetermined internal voltage (IVC). The internal voltage (IVC) is a voltage which is required to operate the first to eighth output buffers 21 to 28. The first to eighth output buffers 21 to 28 receive the internal voltage (IVC) and generate data signals D0 to D7, respectively, to the outside of the semiconductor memory device 11. That is, data DOUT0 to DOUT7 are generated by the first to eighth output buffers 21 to 28, respectively.

FIG. 2 is a circuit diagram of the first and second internal voltage generators 13 and 15. Since the first and second internal voltage generators 13 and 15 have the same structures, only the first internal voltage generator 13 will now be described, in order to avoid duplication of the explanation.

Referring to FIG. 2, the first internal voltage generator 13 is comprised of a differential amplifier, which includes a comparing unit 31 and a current source 33. The current source 33 is comprised of an NMOS transistor 41 the gate of which receives the external control signal (EN). Accordingly, when the external control signal (EN) is active, i.e., at a logic high level, the NMOS transistor 41 is activated. Therefore, a constant current flows from the comparing unit 31 into a ground (GND), so that the NMOS transistor 41 serves as a current source.

The comparing unit 31 includes two NMOS transistors 43 and 45 and three PMOS transistors 47, 49 and 51. A reference voltage (VREF) and the internal voltage (IVC) are applied to the gates of the NMOS transistors 43 and 45, respectively. The two NMOS transistors 43 and 45 compare the two voltages, and the transistor having the higher voltage applied to its gate is turned on harder. That is, when the reference voltage (VREF) is higher than the internal voltage (IVC), the NMOS transistor 43 is turned on harder. On the other hand, when the internal voltage (IVC) is higher than the reference voltage (VREF), the NMOS transistor 45 is turned on harder. By "activated" we mean the device is turned on more than the other device of the pair; they operate in complementary fashion as the total current (through 41) is constant, as further explained below.

Now, the overall operations of the first internal voltage generator 13 shown in FIG. 2 will be described. The external control signal (EN) is activated to a logic high level during reading operation of the semiconductor memory device 11. When the external control signal (EN) is active, the NMOS transistor 41 is activated. Then, the NMOS transistor 43 is activated by the reference voltage (VREF), so that the voltage of a node (N1) decreases. Then, a PMOS transistor 51 is activated, so that the internal voltage (IVC) is pulled up toward to a supply voltage (VCC) level.

When the internal voltage (IVC) becomes higher than the reference voltage (VREF), however, the NMOS transistor 45 is activated. When the NMOS transistor 45 is activated, the voltage of a node (N2) is pulled down. Thus, both of PMOS transistors 47 and 49 are activated. Then, since the voltage level of the node (N1) is increased, the PMOS transistor 51 is deactivated. As the PMOS transistor 51 is deactivated, the voltage level of the internal voltage (IVC) decreases due to the change consumption of the output buffers 21 through 28.

Therefore, according to the degree to which the NMOS transisters 43 and 45 are turned on the internal voltage is output. The second internal voltage generator 15 operates in the same way as the first internal voltage generator 13, and generates an internal voltage having the same level as that of the internal voltage generated by the first internal voltage generator 13 when the external control signal (EN) is activated.

As described above, in the prior art, when the external control signal (EN) is activated, both the first and second internal voltage generators 13 and 15 are both operated so that an internal voltage (IVC) is generated. Even when only the first to fourth output buffers 21 to 24 are used, both the first and second internal voltage generators 13 and 15 generate an internal voltage. As a result, the current supplying capability to the first to fourth output buffers 21 to 24 becomes twice the current supplying capability which would flow when all the first to eighth output buffers 21 to 28 are used. In other words, the current supplying capability to each output buffer increases when the number of output buffers decreases, while the current supplying capability to each output buffer decreases when the number of output buffers increases. Thus, the internal voltage control circuit can not provide a constant current. Furthermore, when the number of output buffers is small, power consumption of the internal voltage generators is increased unnecesarily since both the internal voltage generators are operated.

SUMMARY OF THE INVENTION

It is an object of the present invention to provide an internal voltage control circuit in a semiconductor memory device which supplies a constant current to output buffers regardless of the number of the output buffers.

It is another object of the present invention to provide an internal voltage controlling method for a semiconductor memory device for supplying a constant current to output buffers.

To accomplish the first object, there is provided an internal voltage control circuit comprising a control unit and a plurality of internal voltage generators.

The control unit generates a plurality of controlling signals in response to $\times 2^n (n \geq 2)$ bit composition signals.

The internal voltage generators each generate a predetermined internal voltage, in response to a corresponding control signal among the plurality of control signals and an external control signal which is enabled during reading of data. The control unit comprises logic for activating only (n−1) internal voltage generators in response to the bit composition signals.

Thus, each of the internal voltage generators receives an individual control signal from among the plurality of control signals. Each generator also receives the external control signal EN. Each internal voltage generator includes a current source, which is activated when the control signal and the external control signal are active, and a comparing unit connected to the current source, for generating an internal voltage when the current source is activated.

To accomplish the second object, there is provided a method for controlling an internal voltage in a semiconductor memory device, which controls a plurality of internal voltage generators. Each internal voltage generator is for generating a predetermined internal voltage, in response to a control signal input from an external source and a bit composition signal having $\times 2^n (n \geq 2)$ bit composing information, e.g. X4, X8, etc. The method comprises the steps of: generating a control signal; generating a bit composition signal; and activating (n−1) internal voltage generators responsive to bit composition signals indicative of the number of output buffers in us, e.g. 4, 8, 16, etc.

The internal voltage control circuit according to the present invention can always supply a constant current regardless of the number of output buffers.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF THE PREFERRED EMBODIMENTS

Figure 1:
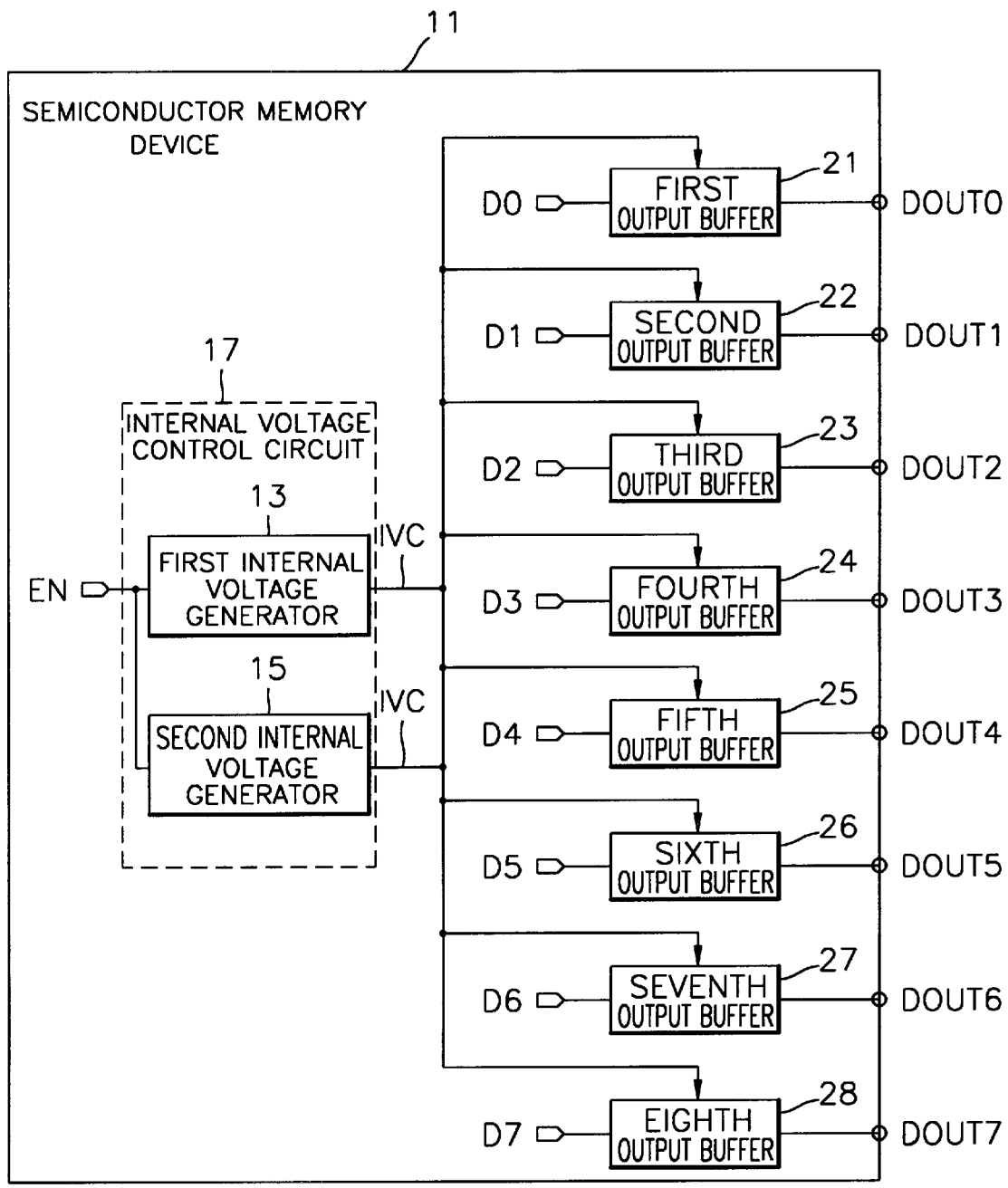
FIG. 1 is a block diagram of a conventional internal voltage control circuit including a semiconductor memory device.
Figure 2:
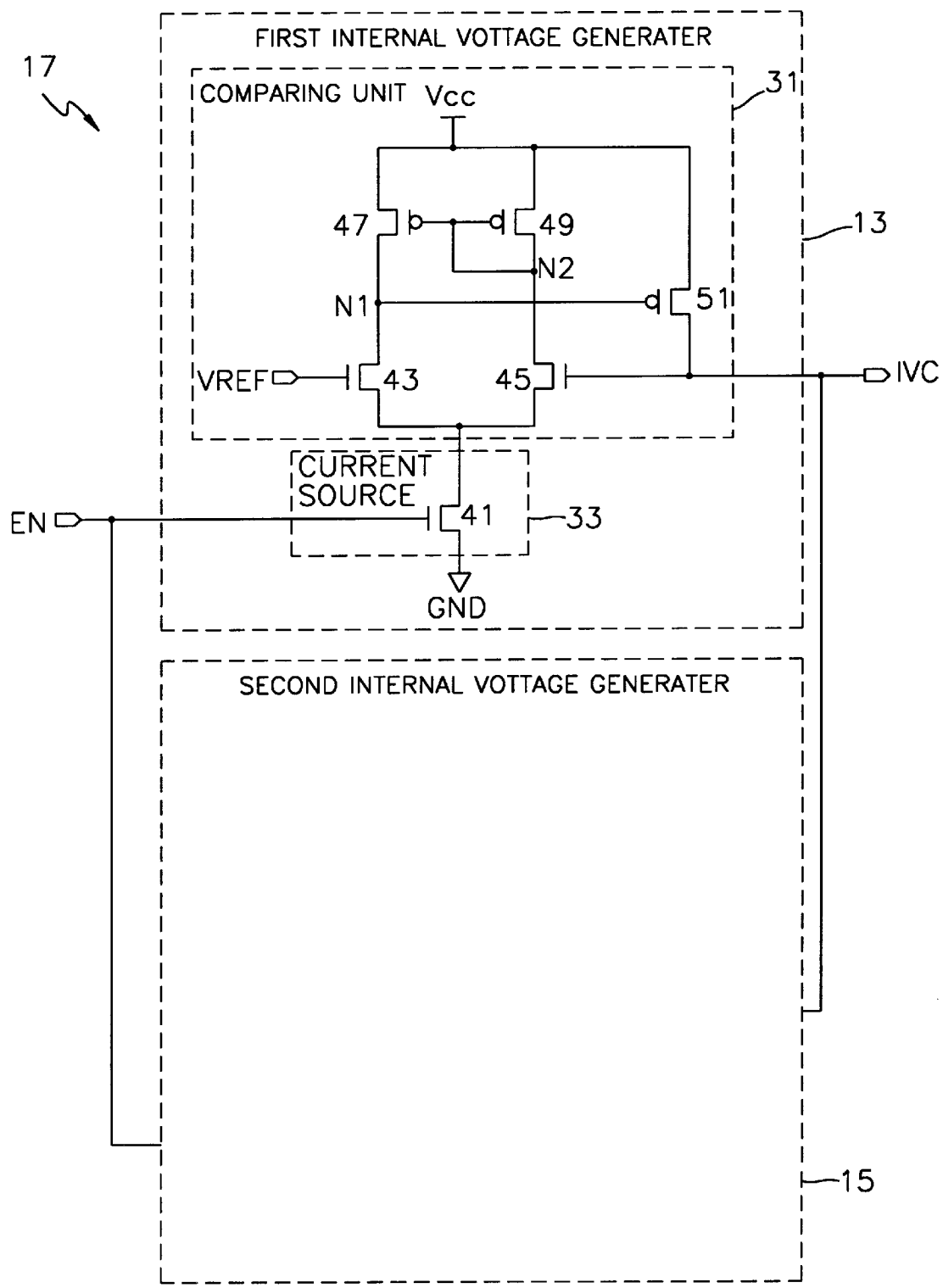
FIG. 2 is a circuit diagram of the first and second internal voltage generators shown in FIG. 1.
Figure 3:
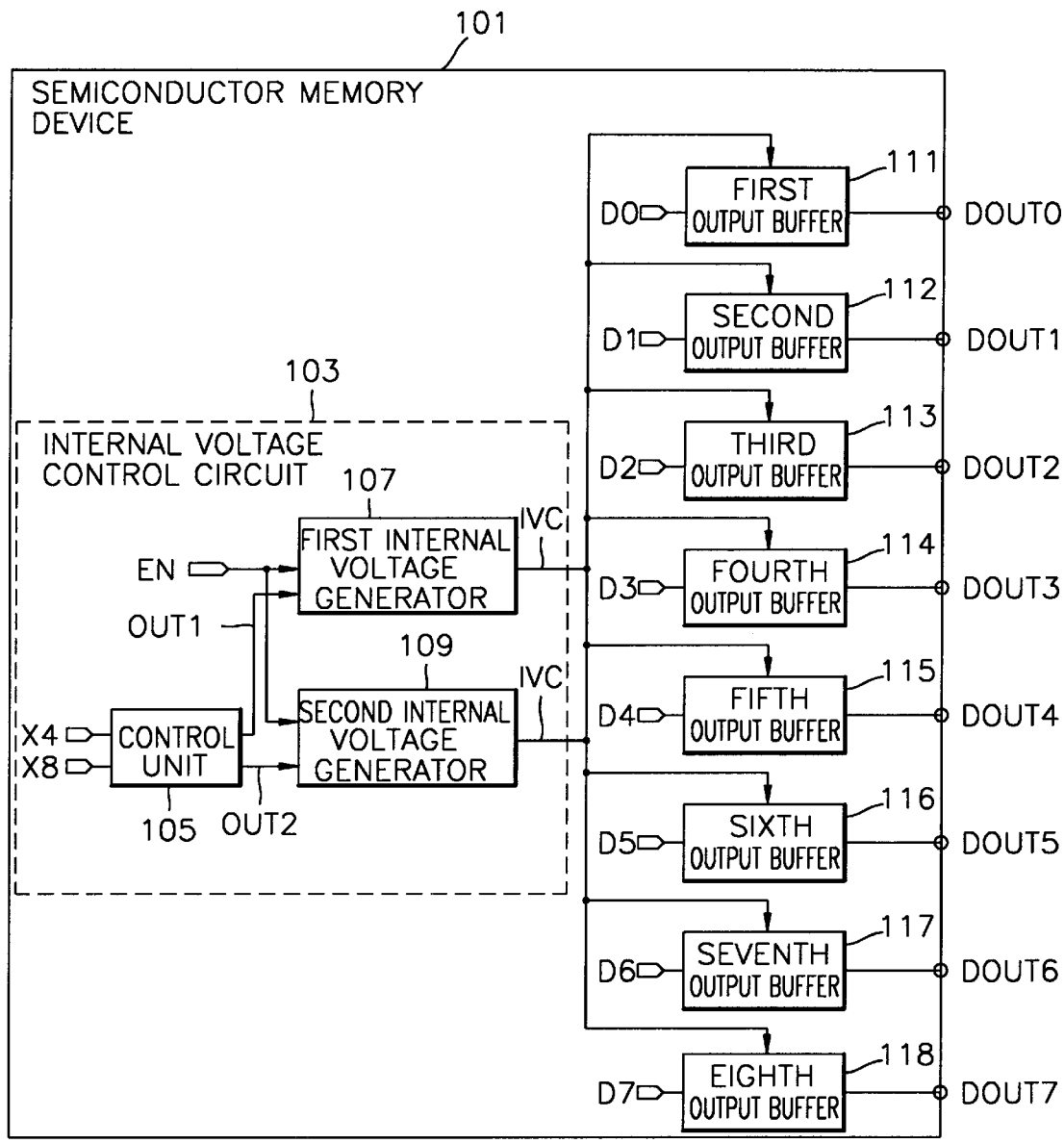
FIG. 3 is a block diagram of a first embodiment of an internal voltage control circuit in a semiconductor memory device according to the present invention.

Referring to FIG. 3, a semiconductor memory device 101 includes an internal voltage control circuit 103 and first to eighth output buffers 111 to 118.

The internal voltage control circuit 103 includes a control unit 105 and first and second internal voltage generators 107 and 109. The control unit 105 receives bit composition signals ×4 and ×8 and generates output signals OUT1 and OUT2.

The first and second internal voltage generators 107 and 109 each receive an external control signal (EN) from the outside, and generate an internal voltage (IVC). When the external control signal (EN) is active, each of the first and second internal voltage generators 107 and 109 generates a predetermined internal voltage (IVC), e.g., a 2.0 V voltage, responsive to the corresponding output signals OUT1 and OUT2. The internal voltage (IVC) is a supply voltage required to operate the first to eighth output buffers 111 to 118. The first to eighth output buffers 111 to 118 are supplied with the internal voltage (IVC), and transfer data signals D0 to D7, respectively, to the outside of the semiconductor memory device 101. That is, the data (DOUT0 to DOUT7) is generated by the first to eighth output buffers 111 to 118.

Figure 4:
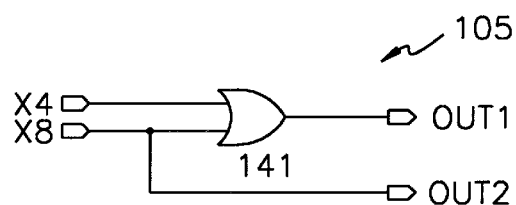
FIG. 4 is a circuit diagram of the control unit shown in FIG. 3.

FIG. 4 is a circuit diagram of the control unit 105 shown in FIG. 3. The control unit 105 receives the bit composition signals ×4 and ×8 and generates the control signals OUT1 and OUT2 as follows. The control unit 105 includes an OR gate 141. The OR gate 141 receives the bit composition signals ×4 and ×8 and generates the control signal OUT1. When at least one of the bit composition signals ×4 and ×8 is logic high, the control signal OUT1 is logic high, and when both the bit composition signals ×4 and ×8 are logic low, the control signal OUT1 is logic low. The control signal OUT2 is the same signal as the bit composition signal ×8. In this way, the first internal voltage generators 107 is activated in response to the ×4 signal, and both the first and second internal voltage generators 107 and 109 are activated in response to the ×8 bit.

Figure 5:
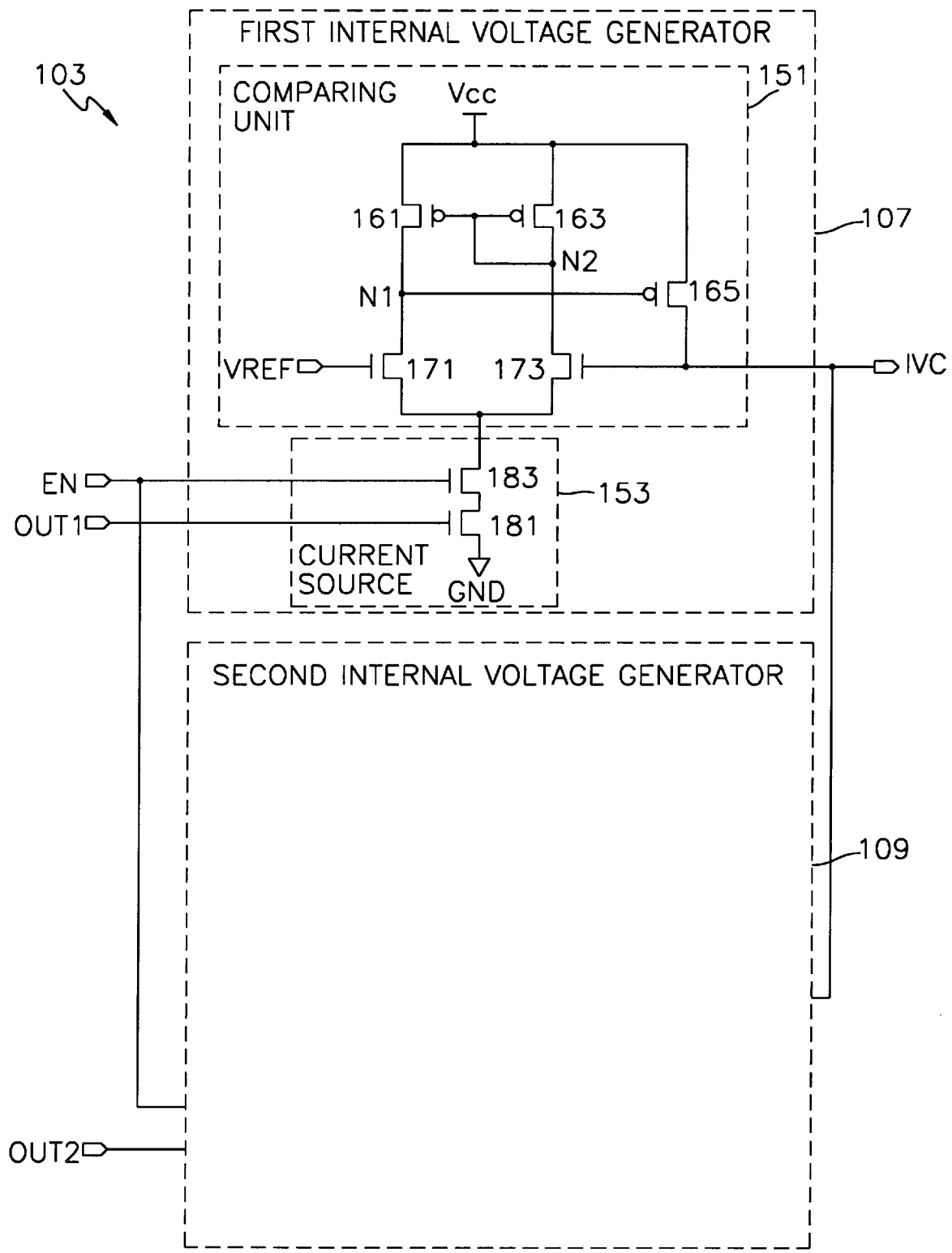
FIG. 5 is a circuit diagram of the first and second internal voltage generators shown in FIG. 3.

FIG. 5 is a circuit diagram of the first and second internal voltage generators 107 and 109 shown in FIG. 3. Since the first and second internal voltage generators 107 and 109 have the same configuration, only the first internal voltage generator 107 will be described.

The first internal voltage generator 107 includes a comparing unit 151 and a current source 153. The comparing unit 151 is comprised of first to third PMOS transistors 161, 163 and 165 and first and second NMOS transistors 171 and 173. The supply voltage Vcc is connected to the sources of the first and second PMOS transistors 161 and 163, and provides the power required to operate the first internal voltage generator 107.

The gates of the first and second PMOS transistors 161 and 163 are connected to the drain of the second PMOS transistor 163. Accordingly, when the drain of the second PMOS transistor 163 is at the supply voltage level (Vcc), a voltage level which does not satisfy the turn-on condition of the first and second PMOS transistors 161 and 163 the first and second PMOS transistors 161 and 163 are deactivated or off, and when the drain of the second PMOS transistor 163 is pulled down toward the ground (GND) voltage level, the first and second PMOS transistors 161 and 163 are activated and pass current provided by the supply voltage (Vcc) to the first and second NMOS transistors 171 and 173.

The source of the third PMOS transistor 165 is connected to the supply voltage (Vcc), and the gate thereof is connected to the drain of the first PMOS transistor 161. Accordingly, when the drain of the first PMOS transistor 161, i.e., a node (N1), is at a voltage level which does not satisfy the turn-on condition of the third PMOS transistor 165, the third PMOS transistor 165 is deactivated. When the node (N1) is at a voltage level which satisfies the turn-on condition of the third PMOS transistor 165, the third PMOS transistor 165 is activated and generates the internal voltage (IVC).

The drain of the first NMOS transistor 171 is connected to that of the first PMOS transistor 161, and the gate thereof is connected to receive a reference voltage (VREF). The reference voltage (VREF) determines, via the IVC, the output logic high voltage Voh of the output buffers when the output data is a logic "1". Thus VREF is selected based on the predetermined specifications of the subject device. Typically the output logic high voltage for a DRAM device would be a minimum of 2.4 volts. Accordingly, the output of the buffers should be no less than 2.4 v in the logic "1" state.

The drain of the second NMOS transistor 173 is connected to the drain of the second PMOS transistor 163, i.e., a node (N2), the gate thereof is connected to the drain of the third PMOS transistor 165, i.e., the internal voltage (IVC), and the source thereof is connected to that of the first NMOS transistor 171. Thus, the degree to which the second NMOS transistor is turned on is determined by the level of the internal voltage (IVC).

The current source 153 is comprised of third and fourth NMOS transistors 181 and 183 arranged in a logical AND configuration as shown. The gate of the third NMOS transistor 181 is connected to receive the control signal (OUT1), and the source thereof is connected to ground (GND). Thus, the third NMOS transistor 181 is activated when the control signal (OUT1) is logic high, and deactivated when the control signal (OUT1) is logic low.

The gate of the fourth NMOS transistor 183 is connected to receive the external control signal (EN), the drain thereof is connected to the sources of the first and second NMOS transistors 171 and 173 which belong to the comparing unit 151, and the source thereof is connected to the drain of the third NMOS transistor 181. Thus, when the external control signal (EN) is logic high, the fourth NMOS transistor 183 is activated, and when the external control signal (EN) is logic low, the fourth NMOS transistor 183 is deactivated. Here, when both the external control signal (EN) and the control signal (OUT1) are logic high, the current source 153 is activated and passes a constant current from the comparing unit 151 to the ground (GND). When either one of the external control signal (EN) and the control signal (OUT1) is logic low, the current source 153 is deactivated and passes no current. When the current source 153 is inactive, the first internal voltage generator 107 does not operate, so that the internal voltage (IVC) is not generated.

The operation of the internal voltage generator shown in FIG. 5 will be described referring to FIGS. 3 and 4. First, a description will be given of the case when only the bit composition signal ×4 is logic high. The bit composition signal ×4 is logic high when only the first to fourth output buffers 111 to 118 are used. At this time, the bit composition signal ×8 is logic low. When the bit composition signal ×4 is logic high, the control signal (OUT1) generated from the control unit 105 is logic high and the control signal (OUT2) therefrom is logic low. Then, the second internal voltage generator 109 is not operated, and only the first internal voltage generator 107 is operated. The external control signal (EN) is a signal which is activated to logic high during data reading of the semiconductor memory device 101. Here, let us suppose that the external control signal (EN) is always logic high, for convenience of explanation. If the external control signal (EN) is deactivated to be logic low, the internal voltage control circuit 103 shown in FIG. 3 is not operated at all. When the external control signal (EN) and the control signal (OUT1) are logic high, the current source 153 is activated.

The internal voltage (IVC) is initially zero, and the reference voltage (VREF) is approximately 2.0 volts. Thus, the first NMOS transistor 171 is activated first. Then, the node (N1) is pulled down, and the third PMOS transistor 165 is activated to transmit the supply voltage (Vcc) therethrough, so that the internal voltage (IVC) is increased to the level of the supply voltage (Vcc). When the internal voltage (IVC) becomes higher than the reference voltage (VREF), the second NMOS transistor 173 is activated so that the node (N2) is pulled down. When the voltage level of the node (N2) is pulled down, the first and second PMOS transistors 161 and 163 are activated so that the voltage of the node (N1) is increased and the third PMOS transistor 165 is deactivated. Due to the charge consumption of the output buffers 111 through 118, the internal voltage (IVC) decreases. When the internal voltage (IVC) becomes lower than the reference voltage (VREF), the second NMOS transistor 173 is deactivated, and the first NMOS transistor 171 is activated so that the voltage of the node (N1) is again lowered to GND, thus the third PMOS transistor 165 is again activated. Thus, the internal voltage (IVC) is again increased.

If the bit composition signal ×8 is activated to logic high, both the control signals OUT1 and OUT2 are logic high. In general, when all the first to eighth output buffers 111 to 118 are used, the bit composition signal ×8 is activated. At this time, the bit composition signal ×4 is logic low. When the control signals OUT1 and OUT2 are both logic high, both of the first and second internal voltage generators 107 and 109 are operated. Therefore, the current supply capability of the internal voltage control circuit 103 is twice that of when only the first internal voltage generator 107 is operated.

As described above, the number of the internal voltage generators which operate according to the bit composition signals ×$2^n$ ($n \geq 2$) is adjusted to (n−1) so that the current providing capability of the internal voltage control circuit 103 is controlled and the internal voltage (IVC) can always be supplied at a constant current. For instance, when the bit composition signal is ×4, one internal voltage generator is operated and generates an internal voltage (IVC). When the bit composition signal is ×8, two internal voltage generators are operated and generate an internal voltage (IVC). When the bit composition signal is ×16, three internal voltage generators are operated and generate an internal voltage (IVC). When the bit composition signal is ×32, four internal voltage generators are operated and generate an internal voltage (IVC)and so on. When the internal voltage (IVC) is supplied at a constant current, the gap between the output hold time (tOH) and the data output time (tSAC) is narrowed. Accordingly, the cycle time (tCC) of data is reduced, so that the semiconductor memory device 101 can have a wide bandwidth.

Figure 6:
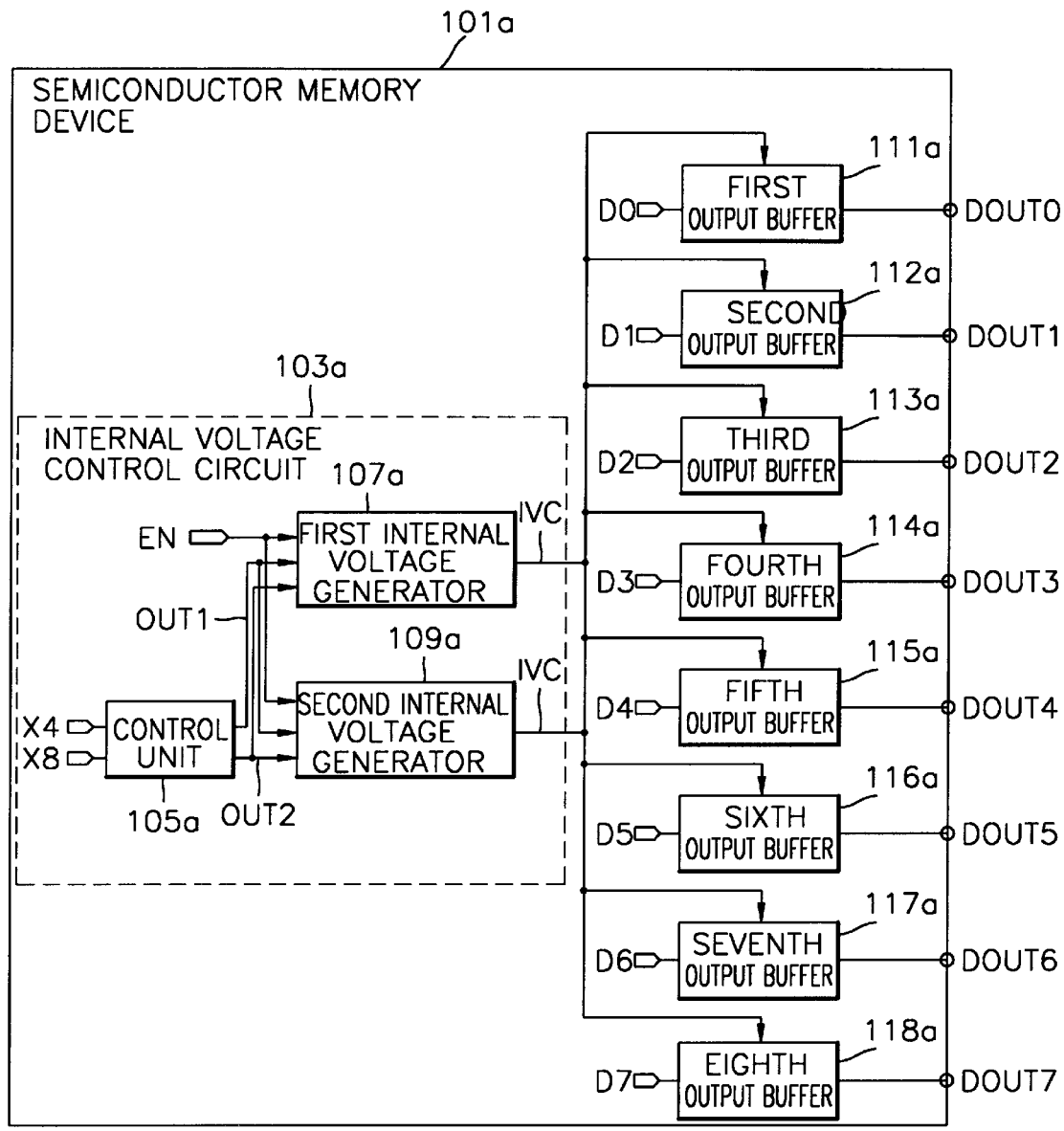
FIG. 6 is a block diagram of a second embodiment of an internal voltage control circuit in a semiconductor memory device according to the present invention.

FIG. 6 is a circuit diagram of a second embodiment of an internal voltage control circuit in a semiconductor memory device according to the present invention. Referring to FIG. 6, a semiconductor memory device 101a includes an internal voltage control circuit 103a and first to eighth output buffers 111a to 118a.

The internal voltage control circuit 103a includes a control unit 105a and first and second internal voltage generators 107a and 109a. The control unit 105a receives bit composition signals ×4 and ×8 and generates output signals OUT1 and OUT2.

Each of the first and second internal voltage generators 107a and 109a receives an external control signal (EN) and control signals OUT1 and OUT2 from the control unit, and generates a predetermined internal voltage (IVC), e.g., 2.0 volts. The external control signal (EN) is logic high when the semiconductor memory device 101a performs read operation. The internal voltage (IVC) is a voltage required for operating the first to eighth output buffers 111a to 118a. The first to eighth output buffers 111a to 118a are supplied with the internal voltage (IVC), and each buffer transfers a corresponding output data signal D0 to D7, respectively, to the outside of the semiconductor memory device 101a. The data (DOUT0 to DOUT7) is generated from the first to eighth output buffers 111a to 118a.

Figure 7:
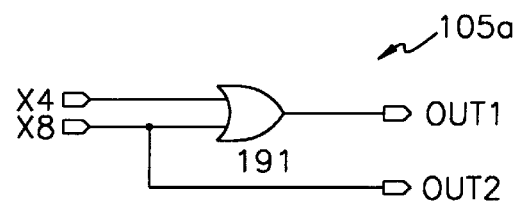
FIG. 7 is a circuit diagram of the control unit shown in FIG. 6.

FIG. 7 is a circuit diagram of the control unit 105a shown in FIG. 6. The control unit 105a receives bit composition signals ×4 and ×8 and outputs the control signals OUT1 and OUT2. The control unit 105a includes an OR gate 191. The OR gate 191 receives the bit composition signals ×4 and ×8 and outputs the control signal OUT1. When at least one of the bit composition signals ×4 and ×8 is logic high, the control signal OUT1 is logic high, and when both of them are logic low, it is logic low. The control signal OUT2 is the same as the bit composition signal ×8.

Figure 8:
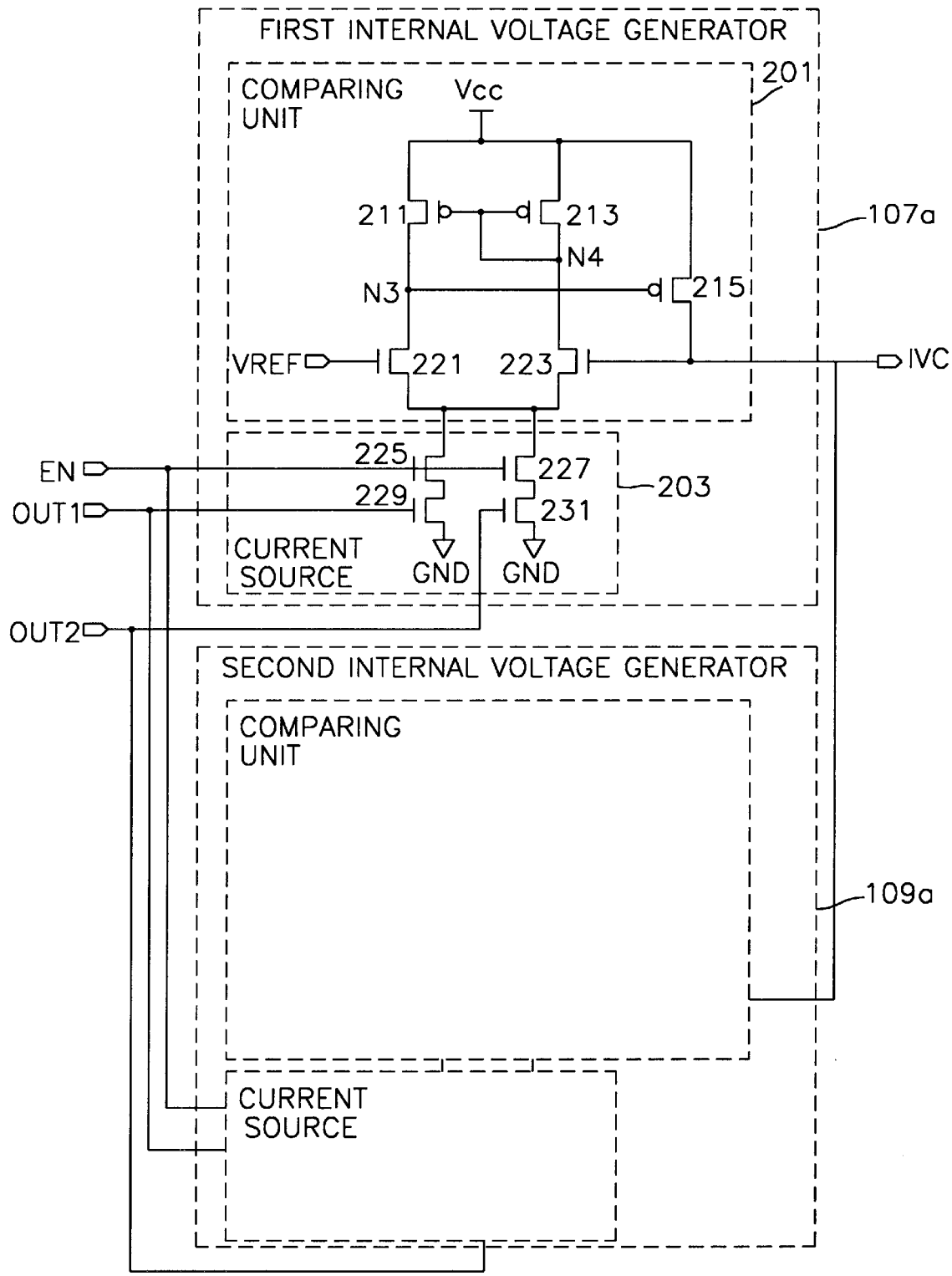
FIG. 8 is a circuit diagram of one embodiment of the first and second internal voltage generators shown in FIG. 6.

FIG. 8 is a circuit diagram of the first and second internal voltage generators 107a and 109a shown in FIG. 6. Since the first and second internal voltage generators 107a and 109a have the same configuration, only the first internal voltage generator 107a will be described to avoid duplicating the explanation.

The first internal voltage generator 107a is comprised of a comparing unit 201 and a current source 203. The comparing unit 201 is comprised of first to third PMOS transistors 211, 213 and 215 and first and second NMOS transistors 221 and 223. A supply voltage (Vcc) is connected to the sources of the first and second PMOS transistors 211 and 213, and provides the power required to operate the first internal voltage generator 107a.

The gates of the first and second PMOS transistors 211 and 213 are connected to the drain of the second PMOS transistor 213. Accordingly, when the drain of the second PMOS transistor 213 is at a voltage level which does not satisfy the turn-on condition of the first and second PMOS transistors 211 and 213, the first and second PMOS transistors 211 and 213 are deactivated. Also, when the drain of the second PMOS transistor 213 is at a voltage level which satisfies the turn-on condition of the first and second PMOS transistors 211 and 213, the first and second PMOS transistors 211 and 213 are activated and provide the supply voltage (Vcc) to the first and second NMOS transistors 221 and 223.

The source of the third PMOS transistor 215 is connected to the supply voltage (Vcc), and the gate thereof is connected to the drain of the first PMOS transistor 211. Accordingly, when the drain of the first PMOS transistor 211 is at a voltage level which does not satisfy the turn-on condition of the third PMOS transistors 215, the third PMOS transistor 215 is deactivated. When the drain of the first PMOS transistor 211 is at the ground (GND) voltage level a voltage level which satisfies the turn-on condition of the third PMOS transistor 215, the third PMOS transistor 215 is activated and generates an internal voltage (IVC).

The drain of the first NMOS transistor 221 is connected to that of the first PMOS transistor 211, and the gate thereof is connected to a reference voltage (VREF). The reference voltage (VREF) is determined by the value of the data generated from the first to eighth output buffers 111a to 118a of FIG. 6, to maintain a predetermined output high voltage (Voh).

The drain of the second NMOS transistor 223 is connected to that of the second PMOS transistor 213, the gate thereof is connected to the drain of the third PMOS transistor 215, i.e., the internal voltage (IVC), and the source thereof is connected to that of the first NMOS transistor 221. Thus, the degree to which the second NMOS transistor is turned is determined by the level of the internal voltage (IVC).

The current source 203 is comprised of third to sixth NMOS transistors 225, 227, 229 and 231. The gates of the third and fourth NMOS transistors 225 and 227 are connected to the external control signal (EN), and the drains thereof are connected to the sources of the first and second NMOS transistors 221 and 223 in the comparing unit 201. Accordingly, when the external control signal (EN) is logic high, the third and fourth NMOS transistors 225 and 227 are activated, and when the external control signal (EN) is logic low, they are deactivated.

The gate of the fifth NMOS transistor 229 is connected to the control signal (OUT1), the drain thereof is connected to the source of the third NMOS transistor 225, and the source thereof is grounded. Accordingly, when the control signal (OUT1) is logic high, the fifth NMOS transistor 229 is activated, and when the control signal (OUT1) is logic low, the fifth NMOS transistor 229 is deactivated.

The gate of the sixth NMOS transistor 231 is connected to the control signal (OUT2), the drain thereof is connected to the source of the fourth NMOS transistor 227, and the source thereof is grounded. Accordingly, when the control signal (OUT2) is logic high, the sixth NMOS transistor 231 is activated, and when the control signal (OUT2) is logic low, the sixth NMOS transistor 231 is deactivated. Here, when at least one of the control signals OUT1 and OUT2 is logic high and the external control signal (EN) is logic high, the current source 203 is activated and allows a constant current to flow from the comparing unit 201 to the ground (GND). However, when the external control signal (EN) and the control signals OUT1 and OUT2 are all logic high, twice as much current flows through the current source 203 as when the external control signal (EN) and only one of the control signals OUT1 or OUT2 are logic high.

Now, the operation of the first internal voltage generator 107a shown in FIG. 8 will be described referring to FIGS. 6 and 7. First, a description will be given of the case when only the bit composition signal x4 is logic high. In general, when only the first to fourth output buffers 111a to 114a are used, the bit composition signal x4 is logic high. At this time, the bit composition signal x8 is logic low. When the bit composition signal x4 is logic high, only the control signal (OUT1) generated from the control unit 105a is logic high. Then, the first and second internal voltage generators 107a and 109a are both operated. However, since the operations of the first and second internal voltage generators 107a and 109a are the same, only the first internal voltage generator 107a will be described to avoid duplicating the explanation. The external control signal (EN) is a signal which is activated to logic high during data reading of the semiconductor memory device 101a. Let us suppose that the external control signal (EN) is always logic high in the circuit shown in FIG. 6, for convenience of explanation. If the external control signal (EN) is deactivated to logic low, neither of the first and second internal voltage generators 107a and 109a are operated. When the external control signal (EN) and the control signal (OUT1) are logic high, only the third and fifth NMOS transistors 225 and 229 in the current source 203 are activated.

The internal voltage (IVC) is initially zero, and the reference voltage (VREF) is 2.0 volts. Thus, the first NMOS transistor 221 is activated first. Then, a node (N3) reaches the ground is pulled down, and the third PMOS transistor 215 is activated to transmit the supply voltage (Vcc) therethrough, whereby the internal voltage (IVC) is increased. When the internal voltage (IVC) becomes higher than the reference voltage (VREF), the second NMOS transistor 223 is activated so that a node (N4) pulls down. At this time, the first PMOS transistor 211 is activated. This raises the voltage of the node (N3), so that the third PMOS transistor 215 is deactivated. At this time, the internal voltage (IVC) starts gradually decreasing due to the charge consumption of the output buffers 111a through 118a more than the second NMOS transistor 213. During that time, the first NMOS transistor 221 is activated so that the voltage of the node (N3) is decreased. Accordingly, the third PMOS transistor 215 is activated again so that the internal voltage (IVC) is increased. The first internal voltage generator 107a generates the internal voltage (IVC) by repeating such operations. The second internal voltage generator 109a also generates the internal voltage (IVC) through the same operation as that of the first internal voltage generator.

If the bit composition signal x8 is enabled to logic high, both the control signals (OUT1) and (OUT2) are logic high. In general, when eight output buffers are used, the bit composition signal x8 is logic high. At this time, the bit composition signal x4 is logic low. When the control signals (OUT1) and (OUT2) are both logic high, all the third to sixth NMOS transistors 225, 227, 229 and 231 are activated. Accordingly, twice as much current flows through the current source 203 as when only the third and fifth NMOS transistors 225 and 229 or only the fourth and sixth NMOS transistors 227 and 231 are activated. As the current flowing through the current source 203 increases, the response speed of the first internal voltage generator 107a to this current is increased and the current supply capability thereof increases.

However, when the current supply capability of the first internal voltage generator 107a increases, that of the second internal voltage generator 109a also increases by the same amount. Thus, the current supply capability of the entire internal voltage control circuit 103a shown in FIG. 6 is enhanced.

As described above, when the bit composition signal x8 is logic high, the current supply capability of the internal voltage control circuit 103a of FIG. 6 is twice that of when the bit composition signal x4 is logic high. Thus, a constant current can be provided to the first to eighth output buffers 111a to 118a. In other words, as the number of active output buffers increases, as indicated by the bit composition signals, the current supply capability of the internal voltage control circuit 103a of FIG. 6 is also increased and a constant internal voltage (IVC) is always supplied. Thus, the semiconductor memory device 101a can have a wide bandwidth. Also, the number of output buffers being used is small, the current supplied by the first and second internal voltage generators 107a and 109a is also small, thus reducing power consumption.

Figure 9:
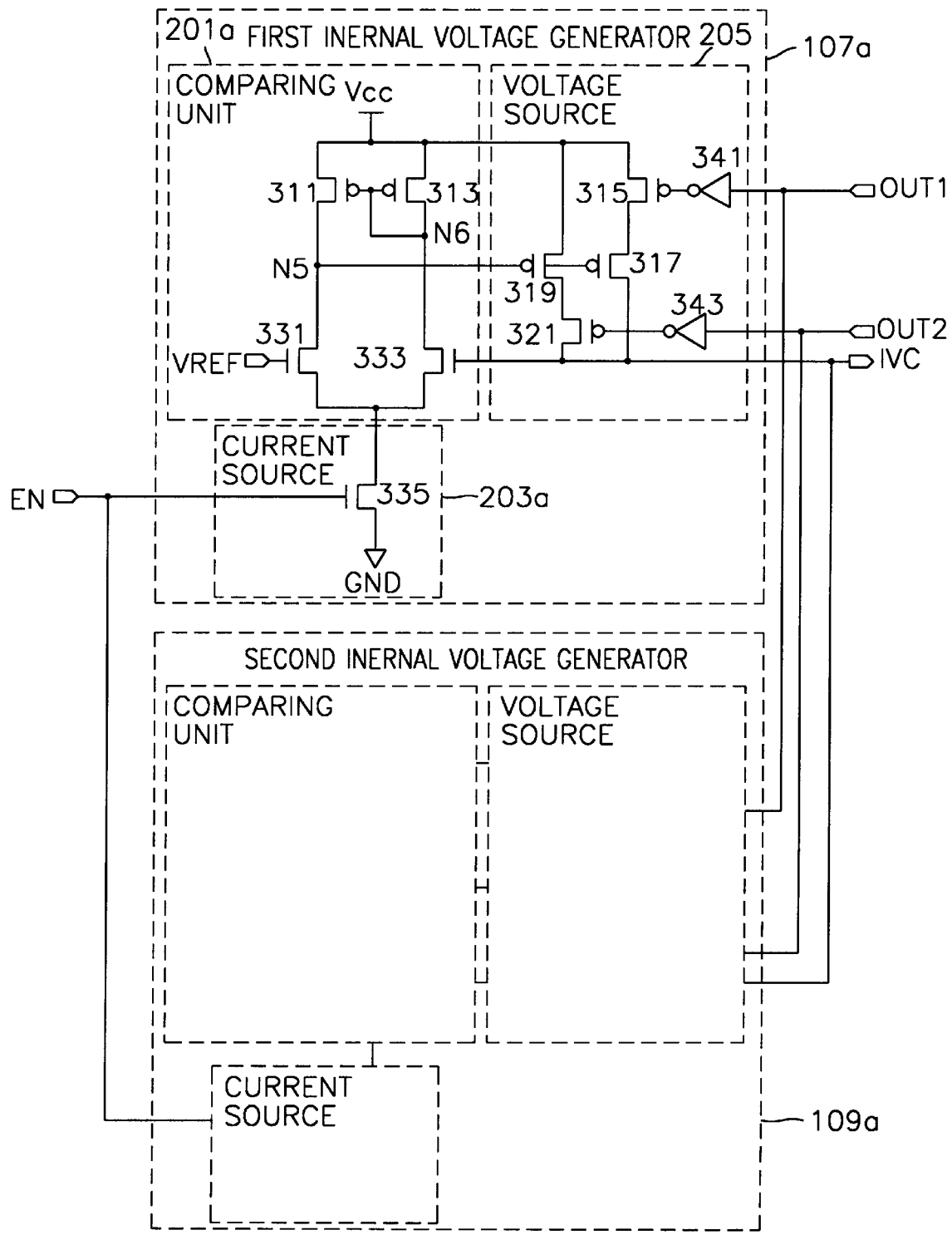
FIG. 9 is a circuit diagram of another embodiment of the first and second internal voltage generators shown in FIG. 6.

FIG. 9 is a circuit diagram of another embodiment of the first and second internal voltage generators 107a and 109a shown in FIG. 6. Since the first and second internal voltage generators 107a and 109a have the same configuration, only the first internal voltage generator 107a will be described to avoid duplicating the explanation.

The first internal voltage generator 107a includes a comparing unit 201a, a current source 203a and a voltage source 205. The comparing unit 201a is comprised of first and second PMOS transistors 311 and 313 and first and second NMOS transistors 331 and 333.

The sources of the first and second PMOS transistors 311 and 313 are connected to a supply voltage (Vcc), and the gates thereof are connected to the drain of the second PMOS transistor 313. Accordingly, when the drain of the second PMOS transistor 313 is at a voltage level which does not satisfy the turn-on condition of the first and second PMOS transistors 311 and 313, the first and second PMOS transistors 311 and 313 are deactivated. Also, when the drain of the second PMOS transistor 313 is at a voltage level which satisfies the turn-on condition of the first and second PMOS transistors 311 and 313, the first and second PMOS transistors 311 and 313 are activated and provide the supply voltage (Vcc) to the first and second NMOS transistors 331 and 333.

The drain of the first NMOS transistor 331 is connected to that of the first PMOS transistor 311. The reference voltage (VREF) is selected to provide IVC to the first to eighth output buffers 111a to 118a such that a predetermined minimum output high voltage (Voh) is maintained.

The drain of the second NMOS transistor 333 is connected to that of the second PMOS transistor 313, the gate thereof is connected to the internal voltage (IVC), and the source thereof is connected to that of the first NMOS transistor 331. Accordingly, whether the second NMOS transistor 333 will be activated or not is determined by the level of the internal voltage (IVC).

The voltage source 205 is comprised of first and second invertors 341 and 343 and third to sixth PMOS transistors 315, 317, 319 and 321, respectively. The first inverter 341 inverts the control signal (OUT1). The second inverter 343 inverts the control signal (OUT2).

The source of the third PMOS transistor 315 is connected to the supply voltage (Vcc), and the gate thereof is connected to the output of the first inverter 341. Accordingly, the third PMOS transistor 315 is activated when the output of the first inverter 341 is logic low, and deactivated when the output of the first inverter 341 is logic high.

The source of the fourth PMOS transistor 317 is connected to the drain of the third PMOS transistor 315, and the gate thereof is connected to the drain of the first PMOS transistor 311, i.e., a node (N5). Accordingly, the fourth PMOS transistor 317 is deactivated when the node (N5) is at a voltage level which does not satisfy the turn-on condition of the fourth PMOS transistor 317, and activated when the node (N5) is at a voltage level which satisfies the turn-on condition of the fourth PMOS transistor 319.

The source of the fifth PMOS transistor 319 is connected to the supply voltage (Vcc), and the gate thereof is connected to the node (N5). Accordingly, similarly to the fourth PMOS transistor 317, when the node (N5) is at a voltage level which does not satisfy the turn-on condition of the fifth PMOS transistor 319, the fifth PMOS transistor 319 is deactivated, and when the node (N5) is at a voltage level which satisfy the turn-on condition of the fifth PMOS transistor 319, the fifth PMOS transistor 319 is activated.

The source of the sixth PMOS transistor 321 is connected to the drain of the fifth PMOS transistor 319, the gate thereof is connected to the output of the second inverter 343, and the drain thereof is connected to the internal voltage (IVC). Accordingly, when the output of the second inverter 343 is logic high, the sixth PMOS transistor 321 is deactivated, and when the output of the second inverter 343 is logic low, the sixth PMOS transistor 321 is activated.

The current source 203a is comprised of a third NMOS transistor 335. The gate of the third NMOS transistor 335 is connected to the external control signal (EN), the drain thereof is connected to the sources of the first and second NMOS transistors 331 and 333 in the comparing unit 201a, and the source thereof is grounded. Accordingly, the third NMOS transistor 335 is activated when the external control signal (EN) is logic high, and is deactivated when the external control signal (EN) is logic low. When the third NMOS transistor 335 is activated, the current source 203a passes a constant current from the comparing unit 201a to the ground (GND). The external control signal (EN) is logic high only during data reading of the semiconductor memory device 101a shown in FIG. 6.

When the external control signal (EN) is logic high and the node (N5) is at the ground (GND) voltage level, then the voltage source 205 is activated and generates the internal voltage (IVC) as long as at least one of the control signals OUT1 or OUT2 is logic high. However, when both the control signals OUT1 and OUT2 are logic high, twice as much current flows through the voltage source 205 as when only one of the control signals OUT1 or OUT2 is logic high. That is, the current supply capability of the first internal voltage generator 107a is doubled.

The operation of the first internal voltage generator 107a shown in FIG. 9 will be described referring to FIG. 6. First, the case when only the control signal (OUT1) is logic high will be described. At this time, the control signal (OUT2) is logic low. When the control signal OUT1 is logic high, the third PMOS transistor 315 is activated. In this state, when the external control signal (EN) is logic high, the third NMOS transistor 335 is activated.

The internal voltage (IVC) is initially zero, and the reference voltage (VREF) is 2.0 volts. Accordingly, the first NMOS transistor 331 is activated first. Then, the node (N5) is pulled down, and the fourth and fifth PMOS transistors 317 and 319 are activated. However, since the sixth PMOS transistor 321 is deactivated, then the fifth PMOS transistor 319 does not have any effect at this point of time although the fifth PMOS transistor 319 is activated. When the third and fourth PMOS transistors 315 and 317 are activated, the supply voltage (Vcc) is transmitted therethrough, so that the internal voltage (IVC) is increased. When the internal voltage (IVC) becomes higher than the reference voltage (VREF), the second NMOS transistor 333 is activated, so that a node (N6) is pulled down. Simultaneously, the first PMOS transistor 311 is activated. This raises the voltage of the node (N5), so that the fourth and fifth PMOS transistors 317 and 319 are deactivated. At this time, the internal voltage (IVC) starts gradually decreasing due to the charge consumption of the output buffers 111a through 118a.

When the first NMOS transistor 331 is activated more than the second NMOS transistor 333, the voltage of the node (N5) is decreased. Accordingly, the fourth and fifth PMOS transistors 317 and 319 are activated again to increase the internal voltage (IVC). The first internal voltage generator 107a generates the internal voltage (IVC) through the repetition of such operations.

If both the control signals OUT1 and OUT2 are both logic high, both the third and sixth PMOS transistors 315 and 321 are activated. If so, twice as much current flows through the voltage source 205 as when only the control signal (OUT1) is logic high. As the amount of current flowing through the voltage source 205 increases, the first internal voltage generator 107a responds much faster to this current, and more effectively supplies the current. However, when the first internal voltage generator 107a supplies the current effectively as described above, the second internal voltage generator 109a also can supply current effectively. Therefore, the internal voltage control circuit 103a of FIG. 6 employing the first and second internal voltage generators 107a and 109a shown in FIG. 9 has an improved entire current supply capability.

As described above, when the bit composition signal ×8 is logic high, the current supply capability of the internal voltage control circuit 103a of FIG. 6 is twice that of when the bit composition signal ×4 is logic high. Thus, a constant current can be supplied to the first to eighth output buffers 111a to 118a. In other words, since the current supply capability of the internal voltage control circuit 103a of FIG. 6 is increased with the bit composition signals, a constant current may be generated. Thus, the semiconductor memory device 101a can have a wide bandwidth. Also, the current supplied from the first and second internal voltage generators 107a and 109a of FIG. 9 is reduced when the bit composition signal decreases, i.e., a decrease in the number of output buffers used, so that power consumption is reduced.

Figure 10:
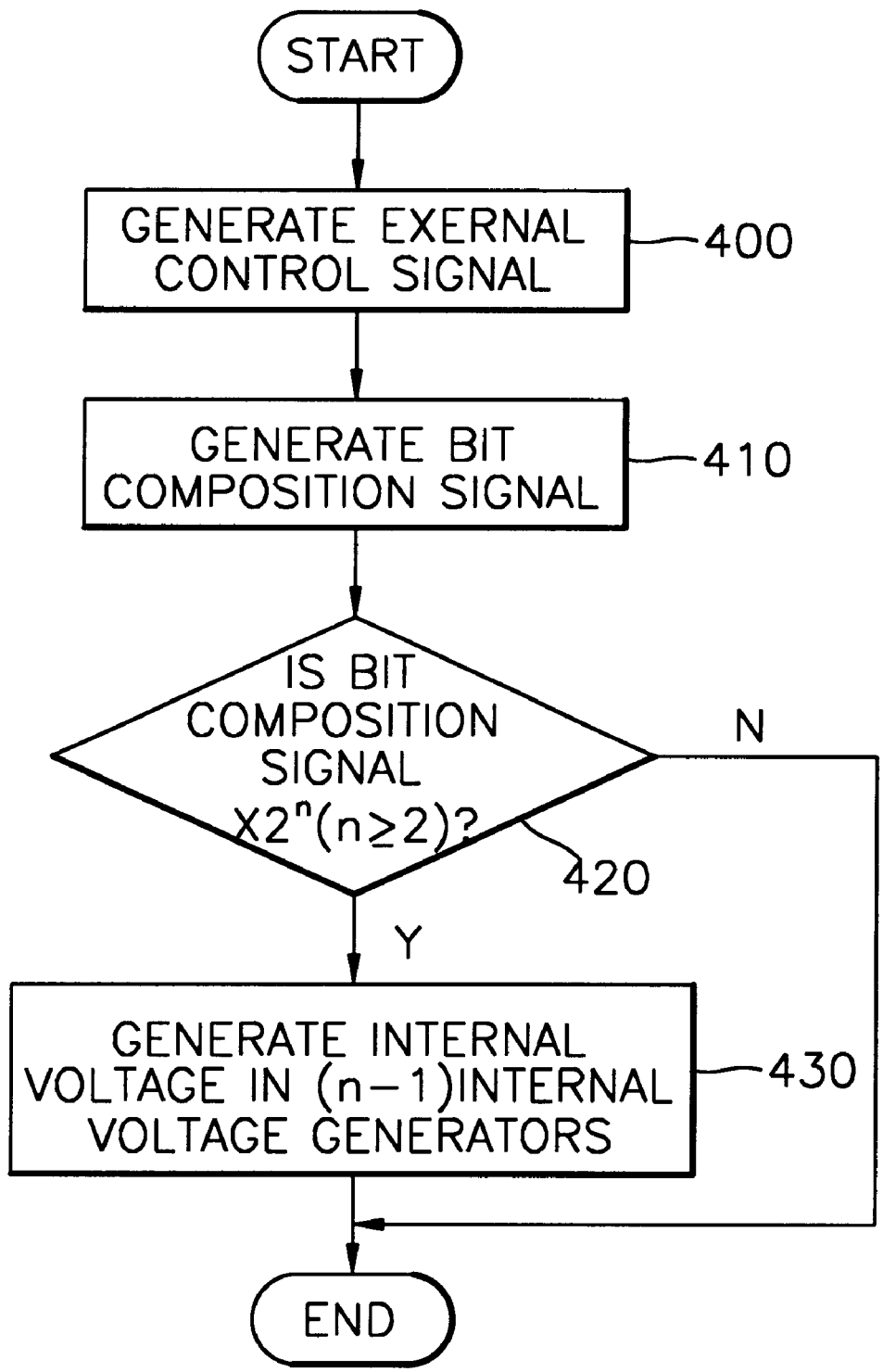
FIG. 10 is a flowchart outlining a first embodiment of a method of controlling an internal voltage according to the present invention.

FIG. 10 is a flowchart representing a first embodiment of an internal voltage controlling method according to the present invention, for a semiconductor memory device having a control unit and internal voltage generators. The flowchart includes external control signal generating step 400, bit composition signal generating step 410, bit composition signal determining step 420, and internal voltage generating step 430.

In step 400, the external control signal (EN) shown in FIG. 3 is enabled during data reading of the semiconductor memory device to put the internal voltage generators into a stand-by state.

In step 410, the bit composition signal ×4 or ×8 shown in FIG. 3 is generated. That is, either the bit composition signal ×4 or ×8 is enabled.

In step 420, whether the bit composition signal is ×$2^n$ (n≧2) or not is determined. For instance, when n equals 2, the bit composition signal is ×4, and when n equals 3, the bit composition signal is ×8.

In step 430, (n−1) internal voltage generators are operated to generate an internal voltage. For example, when n is equal to 2, one internal voltage generator is operated, and, when n is equal to 3, two internal voltage generators are operated to generate the internal voltage. As the value of n becomes large, i.e., the value of the bit composition signal becomes high, the internal voltage generator generates the internal voltage more effectively.

Figure 11:
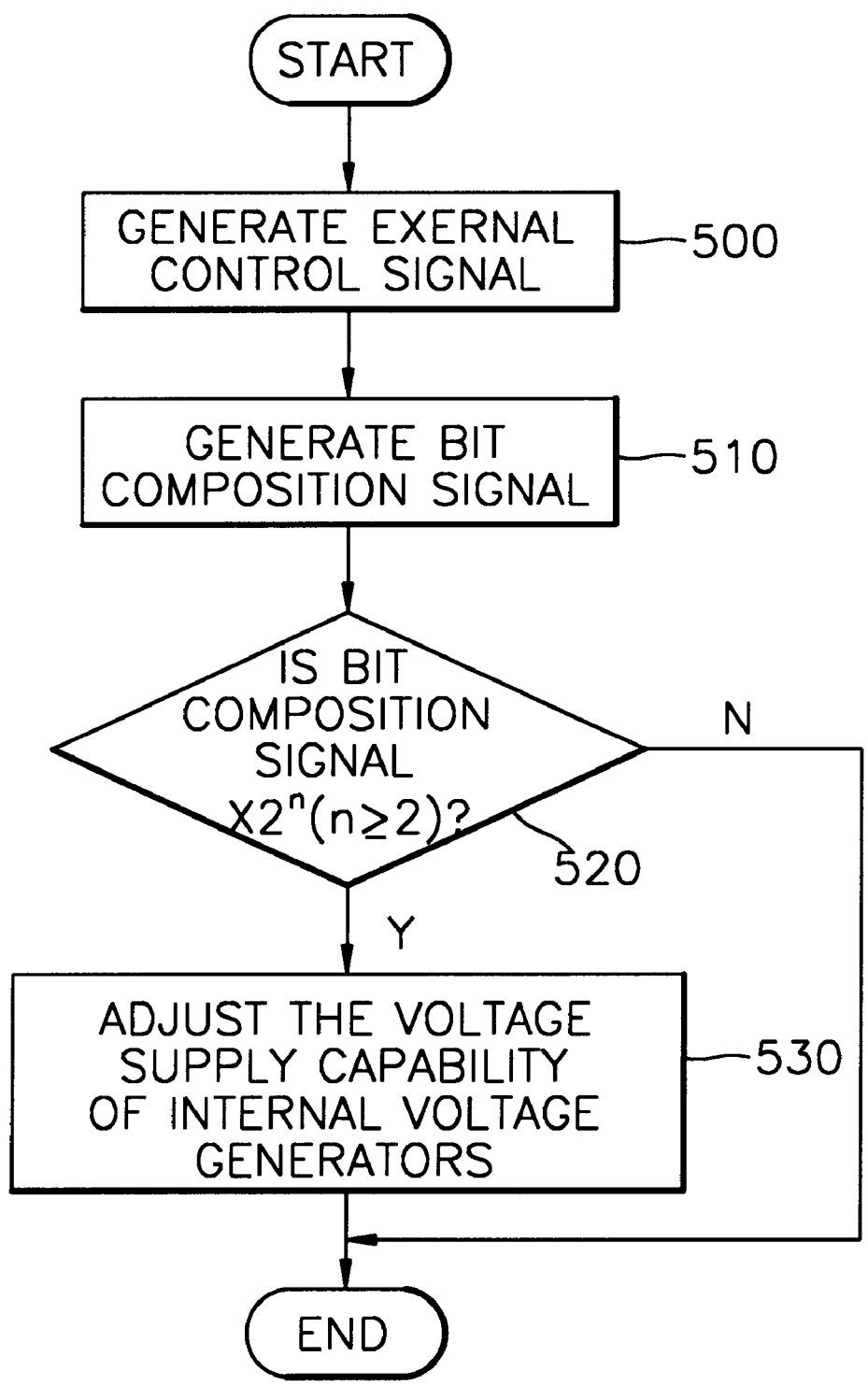
FIG. 11 is a flowchart outlining a second embodiment of a method of controlling an internal voltage according to the present invention.

FIG. 11 is a flowchart representing a second embodiment of an internal voltage controlling method according to the present invention, for a semiconductor memory device having a control unit and internal voltage generators. The flowchart of FIG. 11 includes external control signal generating step 500, bit composition signal generating step 510, bit composition signal determining step 520 and supply current adjusting step 530.

In step 500, the external control signal (EN) of FIG. 6 is enabled during reading of the semiconductor memory device, to put the internal voltage generators into a stand-by state.

In step 510, the bit composition signal ×4 or ×8 of FIG. 6 is generated. That is, either the bit composition signal ×4 or ×8 is enabled.

In step 520, whether the bit composition signal is $\times 2^n$ ($n \geq 2$) or not is determined. For example, when the value of n is 2, the bit composition signal is ×4, and when the value of n is 3, the bit composition signal is ×8.

In step 530, the internal voltage supply capability of the internal voltage generators is varied with the value of n. For example, when the value of n is 2, the internal voltage supply capability of the internal voltage generators is at its minimum, and when the value of n is 3, the internal voltage supply capability of the internal voltage generators is doubled.

As described above, according to the internal voltage controlling circuit of the present invention, when the bit composition signal is small, the current supply capability is reduced, and when the bit composition signal is large, the current supply capability is increased. Accordingly, a constant current is always provided to the output buffers. Also, since the current supply capability is regulated according to the bit composition signal, power consumption is controlled efficiently.

The present invention is not limited to the above-described embodiments, and it is apparent that various modifications may be effected by those skilled in the art within the technical spirit of the present invention.

What is claimed is:

1. An internal voltage controlling circuit in a semiconductor memory device, comprising:

a control unit for generating a plurality of control signals in response to $\times 2^n$(n>2) bit composition signals; and a plurality of internal voltage generators, each for generating a predetermined internal voltage, in response to a corresponding control signal among said plurality of control signals and an internal signal which is enabled during reading of data;

wherein the control unit comprises logic for activating only (n−1) of the internal voltage generators in response to the bit composition signals.

2. The internal voltage controlling circuit in a semiconductor memory device as claimed in claim 1, wherein said $\times 2^n$(n≥2) bit composition signals are ×4, ×8, ×16 and ×32 bit component signals.

3. The internal voltage controlling circuit in a semiconductor memory device as claimed in claim 1, wherein each of said internal voltage generators includes a current source which is activated when said control signal and said internal signal are active; and a comparing unit connected to a supply voltage, a reference voltage source and said current source, for generating an internal voltage when said current source is activated.

4. The internal voltage controlling circuit in a semiconductor memory device as claimed in claim 3, wherein said comparing unit comprises:

a first PMOS transistor whose source is connected to said supply voltage;

a second PMOS transistor whose source is connected to said supply voltage and whose gate and drain are connected to the gate of said first PMOS transistor;

a first NMOS transistor whose drain is connected to that of said first PMOS transistor, gate is connected to said reference voltage, and source is connected to said current source;

a second NMOS transistor whose drain is connected to that of said second PMOS transistor and source is connected to that of said first NMOS transistor; and a third PMOS transistor whose source is connected to said supply voltage, gate is connected to the drain of said first NMOS transistor, and drain is connected to the gate of said second NMOS transistor, wherein an internal voltage is generated at the drain of said third PMOS transistor.

5. The internal voltage controlling circuit in a semiconductor memory device as claimed in claim 3, wherein said current source comprises:

a third NMOS transistor whose gate is connected to one of said control signals and source is grounded; and a fourth NMOS transistor whose source is connected to the drain of said third NMOS transistor, gate is connected to said internal signal, and drain is connected to said comparing unit.

6. The internal voltage controlling circuit in a semiconductor memory device as claimed in claim 1, wherein said control unit comprises:

a NOR gate for receiving ×4 and ×8 bit composition signals and generating a control signal which becomes logic high when at least one of said ×4 and ×8 bit composition signals is logic high; and a buffer for receiving said ×8 bit composition signal and generating a control signal having the same level as that of said ×8 bit composition signal.

7. An internal voltage controlling circuit in a semiconductor memory device, comprising:

a control unit for generating a plurality of control signals in response to a plurality of bit composition signals; and a plurality of internal voltage generators connected to said control unit, for generating a predetermined internal voltage in response to said plurality of control signals and an internal signal which is enabled during reading of data, wherein each of said internal voltage generators can be individually activated by said plurality of control signals and said internal signal.

8. An internal voltage controlling circuit in a semiconductor memory device comprising:

a control unit for generating a plurality of control signals in response to a plurality of bit composition signals; and a plurality of internal voltage generators connected to said control unit, for generating a predetermined internal voltage, in response to said plurality of control signals and an internal signal which is enabled during reading of data, wherein each of said internal voltage generators comprises:
- a current source for receiving said plurality of control signals and said internal signal; and
- a comparing unit connected to a supply voltage, a reference voltage and said current source,
- wherein said internal voltage generators are activated when said internal signal is active and when at least one of said plurality of control signals is active, thus generating an internal voltage from said comparing unit.

9. The internal voltage controlling circuit in a semiconductor memory device as claimed in claim 8, wherein said comparing unit comprises:
- a first PMOS transistor whose source is connected to said supply voltage;
- a second PMOS transistor whose source is connected to said supply voltage and whose gate and drain are connected to the gate of said first PMOS transistor;
- a first NMOS transistor whose drain is connected to that of said first PMOS transistor, gate is connected to said reference voltage, and source is connected to said current source;
- a second NMOS transistor whose drain is connected to that of said second PMOS transistor and source is connected to that of said first NMOS transistor; and
- a third PMOS transistor whose source is connected to said supply voltage, gate is connected to the drain of said first NMOS transistor, and drain is connected to the gate of said second NMOS transistor,
- wherein an internal voltage is generated at the drain of said third PMOS transistor.

10. The internal voltage controlling circuit in a semiconductor memory device as claimed in claim 8, wherein said current source comprises:
- third and fourth NMOS transistors whose drains are connected to said comparing unit and gates are connected to said internal signal;
- a fifth NMOS transistor whose drain is connected to the source of said third NMOS transistor, gate is connected to one of said plurality of control signals, and source is grounded; and
- a sixth NMOS transistor whose drain is connected to the source of said fourth NMOS transistor, gate is connected to another one of said plurality of control signals, and source is grounded.

11. An internal voltage controlling circuit in a semiconductor memory device comprising:
- a control unit for generating a plurality of control signals in response to a plurality of bit composition signals; and
- a plurality of internal voltage generators connected to said control unit, for generating a predetermined internal voltage, in response to said plurality of control signals and an internal signal which is enabled during reading of data, wherein each of said internal voltage generators comprises:
- a current source for receiving said internal signal;
- a voltage source for receiving said plurality of control signals and a supply voltage; and
- a comparing unit connected to a reference voltage, said supply voltage and said current source,
- wherein said internal voltage generators are activated when said internal signal is active and when at least one of said plurality of control signals is active, thus generating an internal voltage from said voltage source.

12. The internal voltage controlling circuit in a semiconductor memory device as claimed in claim 11, wherein said comparing unit comprises:
- a fourth PMOS transistor whose source is connected to said supply voltage;
- a fifth PMOS transistor whose source is connected to said supply voltage and whose gate and drain are connected to the gate of said fourth PMOS transistor;
- a seventh NMOS transistor whose drain is connected to that of said fourth PMOS transistor, gate is connected to said reference voltage, and source is connected to said current source; and
- a eighth NMOS transistor whose drain is connected to that of said fifth PMOS transistor and source is connected to that of said seventh NMOS transistor.

13. The internal voltage controlling circuit in a semiconductor memory device as claimed in claim 11, wherein said voltage source comprises:
- an inverter for inverting a control signal among said plurality of control signals;
- a fourth PMOS transistor whose gate is connected to the output of said inverter and source is connected to said supply voltage;
- a fifth PMOS transistor whose source is connected to the drain of said fourth PMOS transistor and gate is connected to said comparing unit;
- a sixth PMOS transistor whose gate is connected to that of said fifth PMOS transistor and source is connected to said supply voltage;
- a seventh PMOS transistor whose source is connected to the drain of said sixth PMOS transistor and drain is connected to that of said fifth PMOS transistor, for outputting an internal voltage; and
- another inverter for inverting another one among said plurality of control signals and outputting the result to the gate of said seventh PMOS transistor.

14. The internal voltage controlling circuit in a semiconductor memory device as claimed in claim 11, wherein said current source comprises a ninth NMOS transistor whose gate is connected to said internal signal, drain is connected to said comparing unit, and source is grounded.

15. An internal voltage controlling method for a semiconductor memory device controlling a plurality of internal voltage generators for generating a predetermined internal voltage in response to an internal signal and $\times 2^n (n \geq 2)$ bit composition signals, said method comprising the steps of:
- generating said control signal;
- generating said bit composition signal; and
- allowing (n−1) internal voltage generators to be activated according to said bit composition signal.

16. The internal voltage controlling method for a semiconductor memory device as claimed in claim 15, wherein said $\times 2^n (n \geq 2)$ bit composition signals are composed of ×4, ×8, ×16 or ×32.

17. An internal voltage controlling method for a semiconductor memory device controlling a plurality of internal voltage generators for generating a predetermined internal voltage in response to an internal signal and a plurality of $\times 2^n (n \geq 2)$ bit composition signal, the method comprising the steps of:

generating said control signal;

generating said plurality of bit composition signals; and increasing the internal voltage supply capability of said internal voltage generators when said bit composition signal increases, and decreasing that of said internal voltage generators when said bit composition signal decreases.

18. The internal voltage controlling circuit in a semiconductor memory device as claimed in claim 17, wherein said bit composition signal is composed of ×4, ×8, ×16 or ×32.

19. A method of providing power to a plurality of output buffer circuits in a semiconductor memory device during a read operation, the method comprising the steps of:

providing a plurality of internal voltage generator circuits in the memory device, all of the internal voltage generator circuits having outputs connected together to provide power to the output buffer circuits of the memory device;

for a read operation, determining an output word size indicating a number of the output buffer circuits which are active for the read operation;

responsive to a first determined output word size, activating at least one of the internal voltage generator circuits; and for another read operation, activating additional ones of the internal voltage generator circuits if and when the determined output word size is greater than the first determined output word size, thereby providing additional current to the output buffer circuits only when a greater number of the output buffer circuits are in use.

20. A method according to claim 19 including increasing the current sourcing capability of the internal voltage control circuit responsive to an increase in the number of active output buffer circuits, thereby providing adequate power to the output buffer circuits to improve performance without wasting power.

* * * * *

UNITED STATES PATENT AND TRADEMARK OFFICE
CERTIFICATE OF CORRECTION

PATENT NO. : 6,046,954
DATED : April 4, 2000
INVENTOR(S) : Sei-seung Yoon and Yong-cheol Bae It is certified that error appears in the above-identified patent and that said Letters Patent is hereby corrected as shown below:

Throughout the Patent: "external control signal (EN)" should be -- internal signal --.

Column 5,
Line 10, "the supply voltage level (Vcc)" should be removed.

Column 8,
Line 17, "the ground (GND) voltage level" should be removed.

Column 9,
Lines 27-28, "reaches the ground" should be removed.
Line 38, "more than the second NMOS transistor 213" should be removed.
Line 39, insert -- more than the second NMOS transistor 213 -- after "activated".

Column 11,
Line 6, "transistor 319" should be -- transistor 317 --.

Column 13,
Line 51, "x2n(n>2)" should be -- x2n(n≥2) --.

Signed and Sealed this

Twenty-sixth Day of November, 2002

*Attest:*

JAMES E. ROGAN
*Attesting Officer*     Director of the United States Patent and Trademark Office